United States Patent [19]
Glusick

[11] Patent Number: 5,560,361
[45] Date of Patent: Oct. 1, 1996

[54] MRI SYSTEM WITH TIME VARYING GRADIENT DURING SIGNAL ACQUISITION

[75] Inventor: Robert E. Glusick, Waukesha, Wis.

[73] Assignee: General Electric Company, Milwaukee, Wis.

[21] Appl. No.: 190,747

[22] Filed: Jan. 31, 1994

[51] Int. Cl.$^6$ .................................................. A61B 5/055
[52] U.S. Cl. ......................... 128/653.2; 324/307; 324/309
[58] Field of Search ........................ 128/653.2; 324/307, 324/309

[56] References Cited

U.S. PATENT DOCUMENTS

| | | | |
|---|---|---|---|
| Re. 32,748 | 9/1988 | Ordidge et al. | 324/309 |
| 4,527,124 | 7/1985 | van Uijen | 324/309 |
| 5,084,675 | 1/1992 | Reinfelder et al. | 324/309 |

OTHER PUBLICATIONS

Optimal Sampling and Reconstruction of MRI Signals Resulting from Sinusoidal Gradients, *IEEE Transactions on Signal Processing*, Avideh Zakhor, et al., vol. 39, No. 9, Sep. 1991.

*Primary Examiner*—William E. Kamm
*Assistant Examiner*—Brian L. Casler
*Attorney, Agent, or Firm*—Quarles & Brady

[57] ABSTRACT

An NMR system acquires data during the application of a readout gradient that varies in amplitude. The NMR signal is sampled uniformly in time and is mapped to NMR data which is sampled uniformly in k-space by a digital filter. Sets of stored filter coefficients adapt the digital filter to different readout gradient waveforms and different fields of view and image resolution.

2 Claims, 2 Drawing Sheets

5,560,361

MRI SYSTEM WITH TIME VARYING GRADIENT DURING SIGNAL ACQUISITION

BACKGROUND OF THE INVENTION

The field of the invention is nuclear magnetic resonance imaging ("MRI") methods and systems. More particularly, the invention relates to the acquisition of MRI data during a readout gradient that varies in strength.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Most NMR scans currently used to produce medical images require many minutes to acquire the necessary data. The reduction of this scan time is an important consideration, since reduced scan time increases patient throughput, improves patient comfort, and improves image quality by reducing motion artifacts. The concept of acquiring NMR image data in a short time period has been known since 1977 when the echo-planar pulse sequence was proposed by Peter Mansfield (J. Phys. C.10: L55–L58, 1977). In contrast to standard pulse sequences, the echo-planar pulse sequence produces a set of NMR signals for each RF excitation pulse. These NMR signals can be separately phase encoded so that an entire scan of 64 views can be acquired in a single pulse sequence of 20 to 100 milliseconds in duration. The advantages of echo-planar imaging ("EPI") are well-known, and there has been a long felt need for apparatus and methods which will enable EPI to be practiced in a clinical setting.

A characteristic of the EPI pulse sequence and many other fast pulse sequences is that the magnetic field gradient applied while the NMR signal is acquired (i.e., the "readout" gradient) is switched on and off at a very high rate. Indeed, the inability to produce uniform readout gradient fields over very short time intervals has limited the clinical application of EPI and other fast pulse sequences. Due to gradient power supply limitations, gradient coil inductance and FDA limitations, a typical short readout gradient pulse will ramp up in value, plateau for a short interval, and then ramp down to zero. Since the resolution along the readout axis is determined by the area beneath of the readout gradient and the rate at which the NMR signal is sampled, the usual practice is to sample the NMR signal only after the readout gradient has ramped up to its specified constant value. The resulting delay in acquiring the NMR signal is very significant in fast pulse sequences. An alternative approach proposed by Avideh Zakhor, et al. "Optimal Sampling and Reconstruction of MRI Signals Resulting from Sinusoidal Gradients," *IEEE Trans. on Sig. Proc.*, Vol 39, No. 9, pp. 2056–65 (1991) is to vary the sample rate as a function of readout gradient strength, but this requires special receiver hardware and it does not provide optimal SNR or filtering to prevent aliasing of signals outside the desired field of view into the image.

SUMMARY OF THE INVENTION

The present invention relates to an MRI system in which an NMR signal is acquired in the presence of a time varying readout magnetic field gradient and is sampled at a uniform rate. More specifically, the MRI system includes means for exciting spins to produce an NMR signal, a readout gradient generator for producing a magnetic field gradient g(t) which varies in magnitude as a function of time as the NMR signal is produced, a receiver for acquiring the NMR signal while the magnetic field gradient g(t) is produced and for digitizing the acquired NMR signal R(n) by sampling it at a substantially uniform sample rate, a filter which receives the acquired NMR signal samples R(n) and transforms them to filtered NMR signal samples D(m) which correspond to the NMR signal as if it were acquired in the presence of a readout gradient having a constant magnitude, and image reconstruction means for receiving the filtered NMR signal samples D(m) and producing an image. The filter converts the digitized NMR signal samples R(n) which are uniformly sampled in time to filtered NMR signal samples D(m) which are uniformly sampled in k-space as required by the image reconstruction means. The filter may also decimate the digitized NMR signal samples R(n) such that a specified number of signal samples D(m) are provided to the image reconstruction means. And finally, the filter may also include a factor which limits the field of view of the digitized NMR signal samples R(n) such that signals outside the field of view of the reconstructed image are suppressed.

In one embodiment, the filter stores an array of filter coefficients C(n,m) and a different row or column of these stored filter coefficients are applied to the acquired NMR signal samples R(n) to produce each of the filtered NMR signal samples D(m):

$$D(m) = \sum_{n=1}^{N} C(n,m)R(n)$$

Where n=1 through N, and N equals the number of acquired NMR signal samples; and m=1 through M, and M equals the number of desired filtered NMR signal samples.

Because M and N usually are large, the product of M and N is usually very large also, which requires a very large expensive computational burden. In the typical embodiment, only a subset of M is utilized, say T (where T<M), so that the computational burden is only T times N instead of M times N. T is frequently referenced as 'taps' by those practicing digital filter design.

A general object of the invention is to enable an NMR signal to be acquired with a readout gradient that is not constant in magnitude. The successive sets of filter coefficients C(n, m=1 through M) are calculated in advance and stored for use during the acquisition. Their values are determined as a function of the gradient field magnitude g(t) and the desired field of view along the readout gradient axis. Each filtered sample is adjusted in phase to offset the effects of the time varying readout gradient, and the resulting digitized and filtered NMR signal is the same as that which would have been acquired with a fixed readout gradient and a fixed bandpass filter.

Another object of the invention is to filter the acquired NMR signal such that it is limited to the desired field of view. As the readout gradient g(t) varies in magnitude, so does the field of view of the acquired NMR signal. The set of filter coefficients C(n=1 through N, m) for each filtered sample D(m) not only account for the phase shifts due to the time varying readout gradient, but also account for the time varying field of view.

Yet another more specific object of the invention is to simplify the receiver electronics. The receiver may acquire the NMR signal and digitize it at a constant, high sampling rate. No variations in sample rate or filter pass band are required to account for different readout gradient values. Instead, an array of filter coefficients C(n,m) are stored for each readout gradient waveform and each FOV, and these are applied to the acquired and digitized NMR signal to convert it to a format acceptable by the image reconstruction process. This filtering is a preprocessing step which requires no additional hardware and does not significantly increase the image reconstruction time.

Yet another object of the invention is to obtain a higher image resolution in the readout direction without increasing the echo spacing in an EPI sequence. The present invention enables the NMR signals to be acquired while the readout gradient pulse is rising to its constant amplitude and while it is declining from that amplitude. As a result, the readout gradient amplitude can be increased to improve resolution without increasing its duration.

DESCRIPTION OF THE PREFERRED EMBODIMENT

Figure 1:
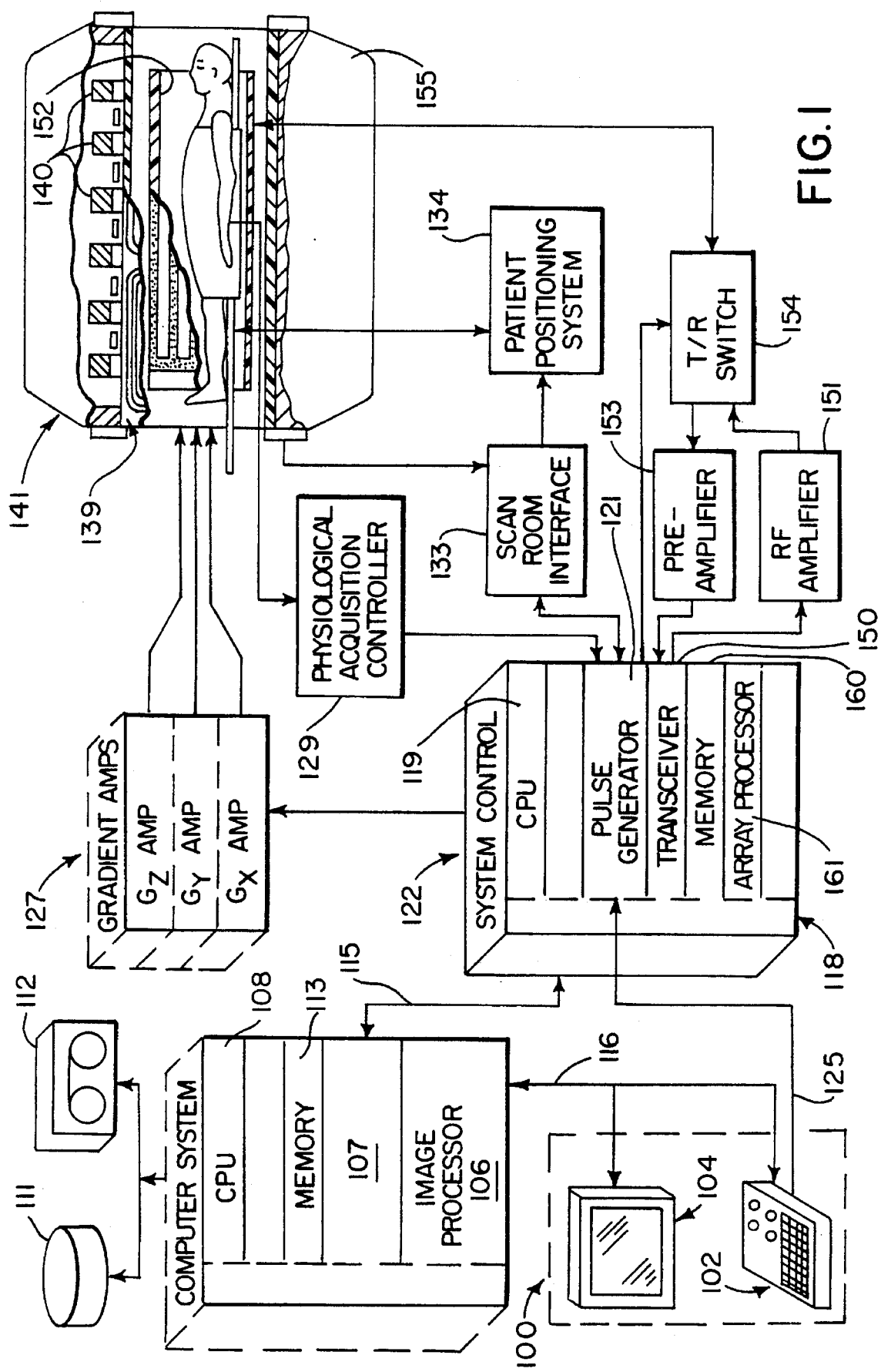
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. One of these gradients ($G_x$ in the preferred embodiment) is applied while an NMR signal is acquired, and the present invention is applicable when this "readout" gradient varies in magnitude as a function of time during signal acquisition. In the discussion below, this time varying readout gradient is symbolized as "g(t)."

The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired and filtered in accordance with the teachings of the present invention, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
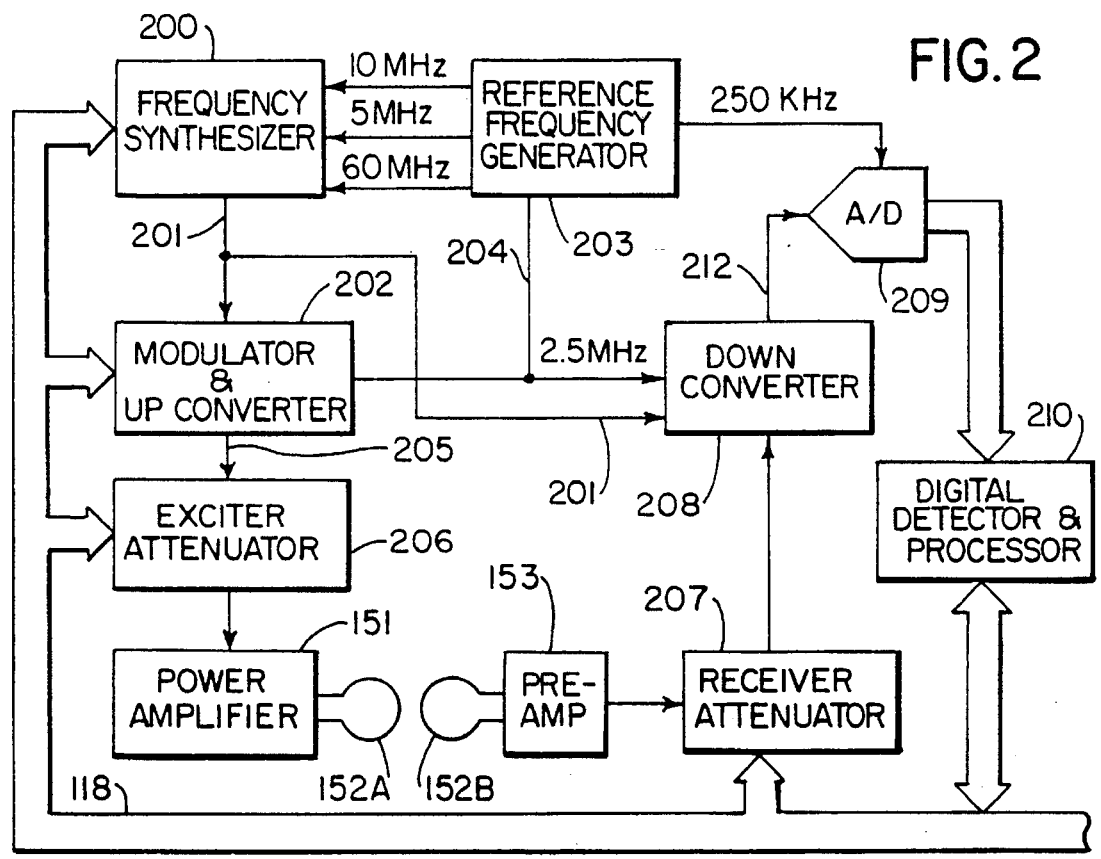
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single whole body coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are filtered and employed to reconstruct an image as will be described in more detail below.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
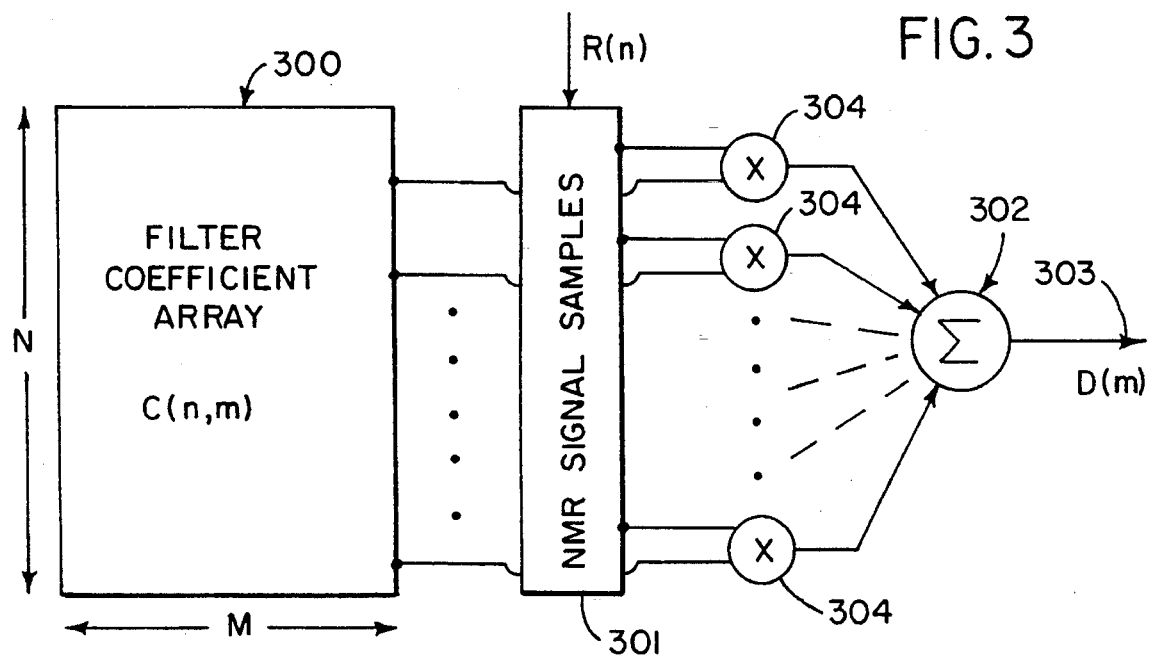
FIG. 3 is a block diagram of the filtering process carried out by the MRI system of FIG. 1 to implement the present invention.

The present invention is implemented by filtering the I and Q samples of the acquired NMR signal with the filter shown in FIG. 3. This filter can be implemented in hardware as part of the transceiver module 150 or array processor 161, or it can be implemented by a processor program executed by CPU module 119. In the general implementation, the invention utilizes an N by M array 300 of filter coefficients which are precalculated for each different readout gradient waveform g(t). N is the number of NMR signal samples acquired by the transceiver as described above at a constant (over) sample rate, and M is the number of filtered samples needed to reconstruct an image as described above. For example, 360 samples may be acquired, while the image reconstruction only requires 128 filtered samples. The coefficients stored in the array 300 are indicated by the symbol C(n,m) in the discussion below; where n is the row number and m is the column number of a coefficient.

In the typical embodiment, only T multipliers 304 are used to implement the filter, where T is commonly called 'taps'. As a result, only the largest values of C(n,m) are used, and they reside on the principle diagonal of C(n,m). T is usually chosen as a compromise between performance and cost.

Referring to FIG. 3, the N acquired samples (I or Q) are input to a register 301 and are applied as inputs to N respective multipliers 304 The other input to each multiplier 304 is a corresponding coefficient (n=1 through N) from one of the columns (m=1 through M) in the array 300. The acquired signal samples are thus multiplied by one column of filter coefficients and the results summed at 302 to produce a single filtered I or Q signal sample D(m=1 through M) at output 303. This multiplication and summing operation is performed M times with the successive M columns of the filter coefficient array 300 to produce the desired M filtered samples for the image reconstruction process. The same process is performed separately on the I and Q components of the acquired NMR signal and the filtered I and Q samples are input directly to the image reconstruction process.

The filter of FIG. 3 can be viewed as a finite impulse response (FIR) filter in which the input signal for each echo remains fixed and the filter coefficient amplitudes are changed to produce the filtered output signal. To accomplish the objectives of the present invention it is, of course, necessary to provide the proper values C(n,m) for the filter coefficient array 300, which will now be discussed in detail. The symbols used in this discussion are defined as follows:

g(t) arbitrary readout gradient waveform, normalized to 1.0 peak over the sampling interval and unipolar over the sampling interval $\tau_1$ through $\tau_N$;

$\tau_1, \tau_N$ start and stop times for input sampling respectively;

$\Delta t$ sample period, effective time between quadrature NMR signal samples;

$f_s$ input sampling frequency (complex pairs/ sec, linearly spaced in time);

N total number of digitized input samples per acquired NMR signal (# filter coefficients =<N). 32=<N=<2048;

M total number of filtered output samples desired, evenly spaced in $K_x$, may be uneven in time. 32=<M=<1024;

T the number of non-zero taps in the filter, which can range from 3 to M. T is usually chosen as a compromise between performance and cost and might typically be M/4;

n input sample index (n=1 to N);

m output sample index (m=1 to M);

R(n) complex NMR signal samples (n=1 to N), linearly oversampled in t, maybe nonlinear in $K_x$;

C(n,m) real filter coefficients in array 300 where only T elements in each row m are non-zero;

D(m) complex output data (m=1 to M), digitally filtered, linearized in $K_x$;

$G_f(n)$ density of calculations (taps) per unit phase space. This is typically the derivative of the phase function, which was calculated as the integral of the normalized gradient function. In this case it is similar to the normalized gradient function;

$P_i(n)$ input phase vector (radians) at each input sample n;

$P_o(m)$ output phase vector (radians) at each output sample m;

r oversampling ratio (peak input bandwidth over peak output bandwidth);

ods output data scroll (+/−sample periods);

cc circular convolution switch (0=off, 1=on=default);

$\alpha$ filter window rolloff factor ($\alpha$=0.46 for Hamming window);

β filter window width factor (i.e., full filter width/desired window width). Typically, β is adjusted to fit significant values of C(n,m) into the available taps T of the filter. The filter coefficients are calculated for each readout gradient waveshape g(t) that may be used during a scan. Its gauss/cm peak amplitude is normalized during the sampling time to 1.0. The function g(t) must represent the gradient "seen" by the spin system in order for the remapping of nonlinearly spaced $K_x$ input data to linearly spaced $K_x$ output data to be correct. Select values $\tau_1$ and $\tau_N$ (the start and stop times for Kx sampling relative to waveshape g(t)). $\tau_1$ and $\tau_N$ must encompass a unipolar portion of g(t) such that the sampling function calculated below will be single valued (i.e. the sampling function has a unique ordinate value for every abscissa value between $\tau_1$ and $\tau_N$). Then create a readout gradient discrete value input scaling vector, where $G_i(n)$ in gauss/cm corresponds to input sample n at $t_n$:

$$G_i(n)=g(t_n) \text{ at } t_n=\tau_1+(n-1)\Delta t. \quad (1)$$

Create the normalized phase function p(t) which depends on the integral of gradient waveform function, g(t). The Larmour constant normalizes out. The result is normalized to the range $-\pi$ to $+\pi$.

A typical method of calculating p(t) is represented below however, in practice, any continuous or discrete integration method may be employed, and the functions may have closed form solutions.

$C_1$ defines the span of the function:

$$C_1 = \int_{\tau_1}^{\tau_N} g(t') dt' \quad (2)$$

$$p(t) = \frac{2\pi}{C_1} \int_{\tau_1}^{t} g(t') dt' - \pi \quad (3)$$

Create the input phase vector $P_i(n)$ in radians for n=1 to N, having values linearly spaced in t. The values will be linearly spaced in phase (i.e., $K_x$) for constant readout gradient or nonlinearly spaced in phase (i.e., $K_x$) for a variable readout gradient.

$$P_i(n)=p(\tau)=(n+1)\Delta t) \text{ for n=1 to N} \quad (4)$$

Create the output phase vector $P_o(m)$ in radians for m=1 to M, having values linearly spaced in phase (i.e., $K_x$).

$$P_o(m)=-\pi+[2\pi(m-1-ods)/(M-1)] \quad (5)$$

$P_o(m)$ should be modulo $2\pi$ on the interval $-\pi$ to $+\pi$. If the output data scroll "ods" is nonzero then scroll the filter's output data (i.e., shift it in time by ods sample periods) by scrolling the phase of the output phase vector $P_o(m)$.

The oversapling ratio "r" for a readout gradient with a peak value during the sampling which is constant over at least two consecutive input samples (i.e., a constant or trapezoid but not cosine readout) is:

$$r = \frac{\text{grad area between 2 closest output samples @ peak}}{\text{grad area between 2 adjacent input samples @ peak}}$$

or equivalently because the gradient is constant over these samples $$r = \frac{\Delta t \text{ between 2 closest output samples @ peak}}{\Delta t \text{ between 2 adjacent input input samples @ peak}}$$

or equivalently.

$$r = \frac{[-P_o(1)+P_o(M)]/(M-1)}{-P_i(N/2)+P_i((N/2)+1)} \quad (6)$$

The "base phase" argument φ in radians is:

$$\phi = P_i(n)-P_o(m).$$

The "phase scroll offset" Θ in radians is:

Θ=2π for $-\infty<\phi<-\pi$

Θ=0 for $-\pi\leq\phi\leq\pi$

Θ=-2π for $\pi<\phi+\infty$

The filter function F can be calculated in a number of ways. The most general and well known way to those skilled in the digital filtering art is the discrete transform of an arbitrary function. Many algorithmic calculations exist for a useful filter function, given specific constraints also well known to the art. The preferred embodiment utilizes the well known concept of a windowed sinc function. In this class of filter functions F, many different window functions W may be selected and they become part of the filter function F.

$$F(x)=W(x)\text{sinc}(bx)/(bx) \quad (7)$$

where b=N/2r b=the filter bandwidth factor which controls the bandwidth of the information passed through the filter, nominally set to the bandwidth of the displayed MRI image.

The window function W employed in the present preferred embodiment is as follows:

$$W(x) = \alpha \cos(\beta x) + (1-\alpha) \text{ for } |\beta x| \leq \pi \quad (8)$$

$$W(x) = 0.0 \text{ for } |\beta x| > \pi \text{ and } cc = 1$$

$$W(x) = 0.0 \text{ for } |\beta \alpha| > \pi \text{ and } cc = 0$$

where: cc=0 or 1: (circular convolution=1, flat=0)
α=window parameter typically 0.46 or 0.5 for Hamming and Hanning cases respectfully
β=full filter width/desired window width The array of coefficients may be calculated in its primitive form $\tilde{C}$ by evaluating the filter function at the selected phase locations, and scaling the result by the density of the phase calculations as shown in the following equation:

$$\tilde{C}(n,m)=G_i(n)F(P_i(n)-P_o(m)+\Theta) \quad (9)$$

While this equation produces the desired result, a typical embodiment requires a specific low frequency gain performance by the filter. If the desired gain is given by a, and the performance of the filter in equation (9) is $a_o$, the well known normalizing calculation yields the desired result:

$$C(n,m) = \frac{a}{a_o} \tilde{C}(n,m) \text{ for all } m \text{ and } n \quad (10)$$

where $a_o$ represents the low pass gain of $\tilde{C}(n,m)$ and is typically calculated by:

$$a_o = \sum_{n=1}^{N} \tilde{C}(n,m) \quad (11)$$

The filter coefficient array C(n,m) is calculated and stored for each unique combination of readout gradient function g(t), input sample number (N), output sample number (M), and the desired filter kernal F. The proper filter coefficient array C(n,m) is automatically loaded into the array 300 when the operator selects the particular scan prescription. When used as described above, the filtered output data D(m) is produced from the acquired complex NMR signal samples R(n) by vector multiplying the complex N point input signal R(n) by row m of the selected filter coefficient array C(n,m) and storing the complex dot product result.

$$D(m) = \sum_{n=1}^{N} C(n,m)R(n) \qquad (12)$$

The m=1 to M filtered output points D(m) are a filtered set of NMR signal samples which are uniformly spaced in k-space as required by the image reconstruction process. In addition, this digitized NMR signal is filtered to ecxlude the alias, which appears in the image as a wrap-around from edge to edge. And finally, the filter also functions to match the number of NMR signal samples, N, to the number of samples, M, required by the image reconstruction processor. If M is less than N, the filter operates to decimate the sampled NMR signal, whereas if M is greater than N, the filter operates to interpolate between the NMR signal samples to produce the required number of output samples.

I claim:

1. A method for producing an image with an NMR system, the steps comprising:
    a) applying an rf excitation pulse to a subject located in the NMR system;
    b) applying a readout magnetic field gradient pulse to the subject which varies in amplitude as a function of time g(t) in accordance with any one of a plurality of selectable functions;
    c) receiving an NMR signal from the subject which is produced during the application of the readout gradient g(t);
    d) digitizing the received NMR signal at a sample rate which is uniform in time, but not uniform in k-space, to produce a set of N acquired NMR signal samples R(n);
    e) filtering the digitized NMR signal samples R(n) in a digital filter which produces M filtered NMR signal samples D(m) which represent the received NMR signal sampled at a uniform rate in k-space;
    f) repeating steps a) through e) to acquire an NMR image data set; and
    g) reconstructing an image from the NMR image data set; and
    wherein the filtering performed in step e) is performed by:
        selecting from a plurality of stored two-dimensional arrays of filter coefficients a two-dimensional array of filter coefficients C(n,m) which correspond with the selected readout gradient function g(t); and
        applying the selected array of filter coefficients C(n,m) to produce each filtered NMR signal sample D(m) where m=1 through M from the acquired NMR signal samples R(n) by performing the following calculations:

$$D(m) = \sum_{n=1}^{N} C(n,m)R(n).$$

2. The method as recited in claim 2 including a plurality of two-dimensional arrays of filter coefficients C(n,m) stored for each of said plurality of selectable readout gradient functions g(t), and wherein the method further includes:
    selecting from said plurality of stored two-dimensional arrays of filter coefficients corresponding to the selected readout gradient function g(t) a two-dimensional array of filter coefficients C(n,m) that corresponds with a desired image field of view and image resolution.

* * * * *